US 6,586,793 B2

(12) United States Patent
Imai et al.

(10) Patent No.: US 6,586,793 B2
(45) Date of Patent: Jul. 1, 2003

(54) FERROELECTRIC MEMORY AND MANUFACTURING METHOD THEREOF

(75) Inventors: Keitaro Imai, Yokohama (JP); Koji Yamakawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/984,518

(22) Filed: Oct. 30, 2001

(65) Prior Publication Data

US 2002/0066914 A1 Jun. 6, 2002

(30) Foreign Application Priority Data

Oct. 30, 2000 (JP) ........................................ 2000-330619

(51) Int. Cl.$^7$ .............................................. H01L 29/76
(52) U.S. Cl. ........................ 257/295; 257/296; 257/298; 257/303; 257/310; 438/3; 438/240; 438/253
(58) Field of Search ................................. 257/295, 296, 257/298, 303, 310; 438/3, 240, 253

(56) References Cited

U.S. PATENT DOCUMENTS

| 5,499,207 | A | * | 3/1996 | Miki et al. ................... 365/149 |
| 5,717,236 | A | * | 2/1998 | Shinkawata ................. 257/306 |
| 5,834,348 | A | * | 11/1998 | Kwon et al. ................. 438/240 |
| 5,903,492 | A | * | 5/1999 | Takashima ................... 365/145 |
| 5,972,722 | A | * | 10/1999 | Visokay et al. ................. 438/3 |
| 5,990,507 | A | * | 11/1999 | Mochizuki et al. ......... 257/295 |
| 6,020,233 | A | * | 2/2000 | Kim ............................ 438/240 |
| 6,043,526 | A | * | 3/2000 | Ochiai ........................ 257/295 |
| 6,075,264 | A | * | 6/2000 | Koo ............................ 257/295 |
| 6,121,649 | A | * | 9/2000 | Kunishima .................. 257/295 |
| 6,153,898 | A | * | 11/2000 | Watanabe et al. ........... 257/295 |
| 6,218,197 | B1 | * | 4/2001 | Kasai ............................. 438/3 |
| 6,229,166 | B1 | * | 5/2001 | Kim et al. ................... 257/295 |
| 6,278,152 | B1 | | 8/2001 | Hieda et al. |
| 6,281,537 | B1 | * | 8/2001 | Kim ............................ 257/295 |
| 6,313,491 | B1 | * | 11/2001 | Shuto .......................... 257/295 |
| 6,337,216 | B1 | * | 1/2002 | Koo ............................... 438/3 |
| 6,441,420 | B1 | * | 8/2002 | Nagano et al. ............. 257/296 |

FOREIGN PATENT DOCUMENTS

JP         11-17116          1/1999

* cited by examiner

*Primary Examiner*—Hoai Ho
*Assistant Examiner*—Andy Huynh
(74) *Attorney, Agent, or Firm*—Finnegan, Henderson, Farabow, Garrett & Dunner, L.L.P.

(57) ABSTRACT

A ferroelectric memory includes first and second plugs respectively connected to one and the other of source/drain regions of the transistor formed on a semiconductor wafer. A first capacitor electrode is connected to the first plug and located at a position above the transistor. The first capacitor electrode includes first and second capacitor faces on the second plug side and a side reverse thereto, respectively. A ferroelectric film is disposed on the first capacitor face. A second capacitor electrode is connected to the second plug and located at a position above the transistor. The second capacitor electrode is disposed on the first capacitor face through the ferroelectric film.

18 Claims, 7 Drawing Sheets

FERROELECTRIC MEMORY AND MANUFACTURING METHOD THEREOF

CROSS-REFERENCE TO RELATED APPLICATIONS

This application is based upon and claims the benefit of priority from the prior Japanese Patent Application No. 2000-330619, Oct. 30, 2000, the entire contents of which are incorporated herein by reference.

BACKGROUND OF THE INVENTION

1. Field of the Invention

The present invention relates to a ferroelectric memory and a manufacturing method thereof, and more specifically to a memory having a structure in which a ferroelectric capacitor is disposed above a transistor, and a method of manufacturing the same.

2. Description of the Related Art

In recent years, ferroelectric memories, which are non-volatile memories utilizing a ferroelectric thin film, have been progressively developed. Ferroelectric memories have a basic structure in that an insulating film used in the capacitor section of a DRAM is replaced with a ferroelectric film. Ferroelectric memories have the following characteristics and are expected to be memories of the next generation.

(1) It is possible to perform the writing and erasing at high speed. Where small memory cells are used, a writing time of 100 ns or less can be realized, as in DRAMs.

(2) It is possible to perform the rewriting many times. Where some schemes are put for ferroelectric materials (PZT, SBT, etc.), and electrode materials (Pt, $IrO_x$, $RuO_x$, $SrRuO_3$, etc.), the number of rewrites can be $10^{12}$ or more.

(3) It is possible to realize high density and high degree of integration, as high as DRAMs in principle.

(4) It is possible to set the writing voltage used therein at about 2V, thereby reducing the power consumption.

(5) It is possible to perform a bit-rewriting and random access.

Because of these advantages, it has been realized or examined to apply the ferroelectric memories to many fields and directions. Furthermore, there is another future target of using the ferroelectric memories in place of DRAMs, SRAMs, or EEPROMs, by making the ferroelectric memories with high degree of integration and high capacity.

Ferroelectrics have a property of spontaneous polarization, whose direction can be reversed by electric fields. The spontaneous polarization has polarization values even when no electric field is applied (residual polarization), wherein the values (the direction of polarization) depend on a state before the electric field becomes zero. Depending on the direction of the electric field, an electrical charge of + (plus) or − (minus) can be induced on the crystal surfaces, to correspond to "0" or "1" of memory elements. The ferroelectric memories can employ a structure of 1T/1C (one transistor/one capacitor) as in DRAMs, but they employ a structure of 2T/2C to ensure reliability under the current state of affairs.

As one of the types of these ferroelectric memories, there is a ladder type of structure, in which a transistor and a capacitor are connected in parallel, and a plurality of such combinations are connected in series. This type is advantageous in that the cell occupation area is small, because bit line plugs do not have to be led out from all cells.

However, even in ferroelectric memories having the ladder structure, it is not so easy to make them downsized and more highly integrated due to difficulties in working processes and fluctuations in properties. A three-dimensional arrangement of capacitors, which may be a technique of increasing capacity, is also thought to be more difficult because of the reasons described above, and other difficulties in working processes.

Specifically, for example, when electrode materials and ferroelectric materials are worked by RIE (Reactive Ion Etching), a conversion error, such as a CD (Critical Dimension) gain, is inevitable in the working process of capacitors, in addition to difficulties in the working process. The conversion error is necessary to prevent leakage current from increasing due to residues produced when electrode materials, such as Pt, is worked. Furthermore, even if a three-dimensional arrangement is adopted, a sufficient capacitor area is not necessarily secured, thereby hardly providing a sufficient quantity of electric charges for polarization.

With conventional techniques, it is unavoidable to employ very complicated processes, in order to solve these problems. Consequently, downsizing of memory cells by three-dimensional arrangements of capacitors has not been advanced sufficiently to obtain advantages for high degree of integration.

It is therefore demanded to develop a structure of ferroelectric memory and a method of manufacturing the same, which reduce the conversion error and fluctuation of patterns due to lithograph or downsize-working, and thus improve downsizing, degree of integration, and reliability.

BRIEF SUMMARY OF THE INVENTION

According to a first aspect of the present invention, there is provided a ferroelectric memory including a transistor and a capacitor disposed on a semiconductor wafer, the memory comprising:

a first plug connected to one of source/drain regions of the transistor, and extending to a position above the transistor;

a second plug connected to the other of source/drain regions of the transistor and extending to a position above the transistor;

a first capacitor electrode connected to the first plug and located at a position above the transistor, the first capacitor electrode including first and second capacitor faces on the second plug side and a side reverse thereto, respectively;

a ferroelectric film disposed on the first capacitor face of the first capacitor electrode; and a second capacitor electrode connected to the second plug and located at a position above the transistor, the second capacitor electrode being disposed on the first capacitor face of the first capacitor electrode through the ferroelectric film.

According to a second aspect of the present invention, there is provided a ferroelectric memory comprising:

a semiconductor substrate;

first, second, and third source/drain regions formed in a surface of the substrate, the first source/drain region being interposed between the second and third source/drain regions;

first and second gate electrodes facing, through a gate insulating film, a first channel region between the first and second source/drain regions, and a second channel region between the first and third source/drain regions, respectively;

an inter-level insulating film covering the first, second, and third source/drain regions;

first, second, and third plugs penetrating the inter-level insulating film, and electrically connected to the first, second, and third source/drain regions, respectively;

a first capacitor electrode disposed above the first source/drain region, and electrically connected to the first source/drain region via the first plug;

first and second capacitor insulating films each comprising a ferroelectric film, formed on side surfaces of the first capacitor electrode facing the second and third source/drain regions; and second and third capacitor electrodes disposed above the second and third source/drain regions, and electrically connected to the second and third source/drain regions via the second and third plugs, respectively, the second and third capacitor electrodes facing the first capacitor electrode through the first and second capacitor insulating films, respectively.

According to a third aspect of the present invention, there is provided a method of manufacturing a ferroelectric memory including a transistor and a capacitor disposed on a semiconductor wafer, the method comprising:

forming a first plug connected to one of source/drain regions of the transistor, and extending to a position above the transistor;

forming a second plug connected to the other of source/drain regions of the transistor and extending to a position above the transistor;

forming a first capacitor electrode connected to the first plug and located at a position above the transistor, the first capacitor electrode including first and second capacitor faces on the second plug side and a side reverse thereto, respectively;

forming a ferroelectric film disposed on the first capacitor face of the first capacitor electrode; and forming a second capacitor electrode connected to the second plug and located at a position above the transistor, the second capacitor electrode being disposed on the first capacitor face of the first capacitor electrode through the ferroelectric film.

DETAILED DESCRIPTION OF THE INVENTION

First Embodiment

Figure 1:
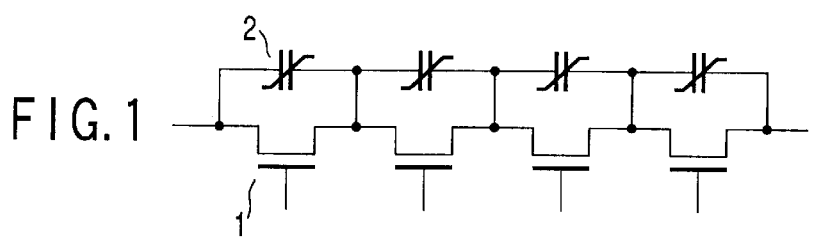
FIG. 1 is a view showing the circuit structure of a ferroelectric memory according to a first embodiment of the present invention.

FIG. 1 is a view showing the circuit structure of a ferroelectric memory according to a first embodiment of the present invention. As shown in FIG. 1, a plurality of switching transistors 1 are connected to each other in series. A plurality of ferroelectric capacitors 2 are respectively connected to the transistors 1 one by one in parallel. Namely, this ferroelectric memory has a so-called ladder structure.

An explanation will be given of the structure of the ferroelectric memory according to this embodiment and a manufacturing process thereof, with reference to FIGS. 2A to 3B. FIGS. 2A to 3B are sectional-perspective views showing steps of manufacturing the ferroelectric memory according to the first embodiment.

First, on the surface of a semiconductor substrate or wafer, e.g., p-Si substrate 100, device isolation regions are formed (not shown). For example, the device isolation regions are formed by forming device isolation trenches at positions other than transistor active regions, and filling the trenches with $SiO_2$ (Shallow Trench Isolation).

Figure 2A:
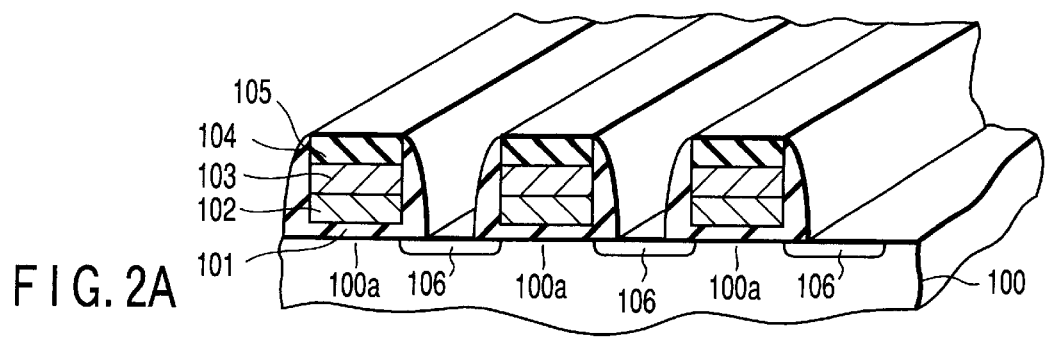
FIGS. 2A to 2C are sectional-perspective views showing steps of manufacturing the ferroelectric memory according to the first embodiment.

Then, as shown in FIG. 2A, transistors for switching operation are formed. Specifically, the substrate is thermally oxidized, so that an oxide film 101 having a thickness of about 6 nm is formed all over as a gate insulating film. Then, an $n^+$-polycrystalline Si film 102 doped with arsenic is formed all over. A $WSi_x$ film 103 and a nitride film 104 are formed on the polycrystalline Si film 102. The polycrystalline Si film 102, the $WSi_x$ film 103, and the nitride film 104 are worked by a conventional photo-lithography method and an RIE (Reactive Ion Etching) method to form gate electrodes each facing a channel region 100a through the gate insulating film 101. Then, a nitride film 105 is deposited and worked by a sidewall-leaving process using an RIE method to form spacer portions of an insulating film on sidewalls of the gate electrodes. Then, source/drain regions 106 are formed to sandwich each of the channel regions 100a by an ion implanting method and a heat treatment, though no detailed explanation will be given of these processes.

Figure 2B:
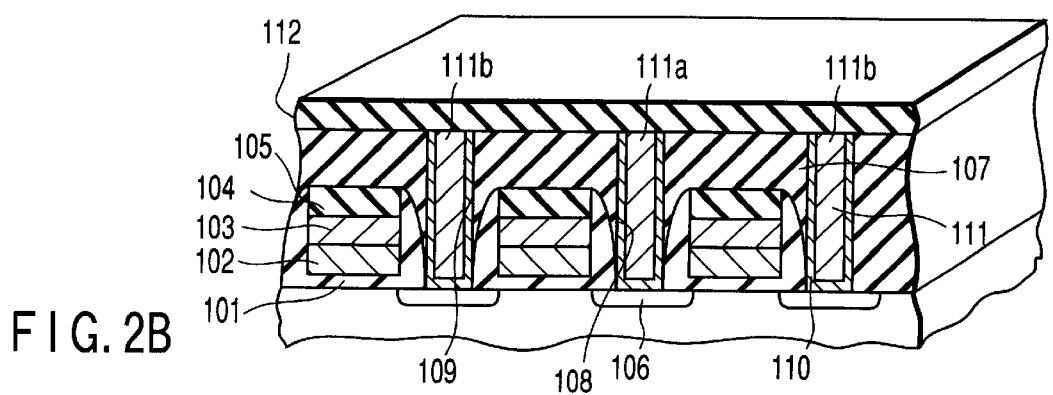

Then, as shown in FIG. 2B, a CVD oxide film 107 is deposited all over as an inter-level insulating film, and is planarized by a CMP (Chemical and Mechanical Polishing) method. Contact holes 108 and 109 are formed in the insulating film 107 in a self-alignment manner to communicate with source/drain regions 106 of the transistors. Then, a thin titanium film is deposited by a sputtering method or a CVD method, and is heat-treated in a forming gas ($N_2+H_2$) to form a TiN film 110.

Then, a tungsten film 111 is deposited all over by a CVD method. Part of the tungsten film 111 outside the contact holes 108 and 109 is removed, so that the contact holes 108 and 109 are filled with the left part of the tungsten film 111. Then, a CVD nitride film 112 is deposited all over as an inter-level insulating film. In this resultant structure, the portions of the tungsten film 111 embedded in the contact holes 108 are to be used as first plugs 111a. The portions of tungsten film 111 embedded in the contact holes 109 are to be used as second plugs 111b.

Figure 2C:
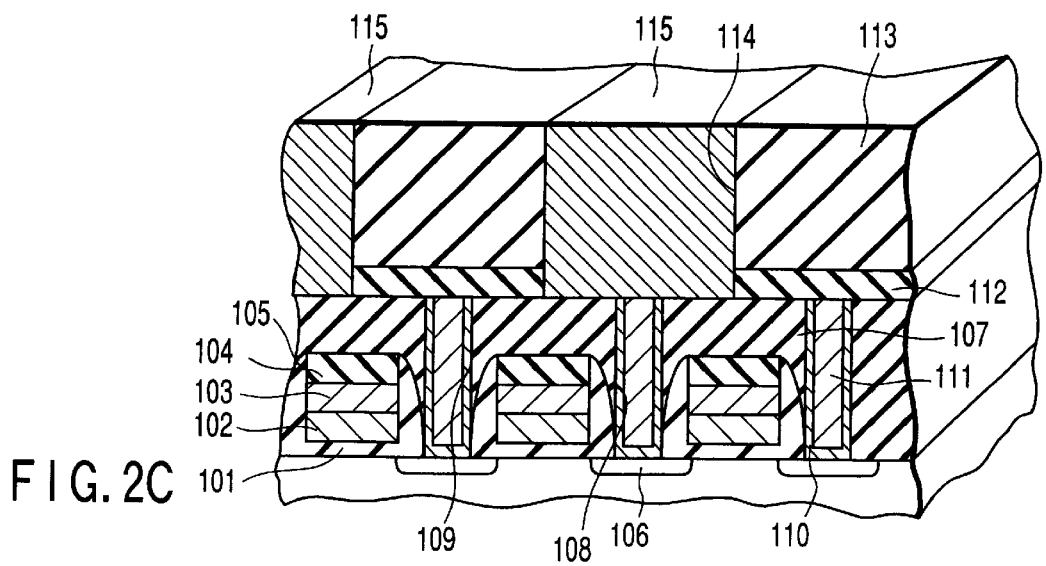

Then, as shown in FIG. 2C, a thick CVD oxide film 113 is deposited all over. Striped opening portions 114 are formed by a photo-lithography method and an RIE method in the CVD oxide film 113 to respectively communicate with the contact holes 108. Then, a first platinum (Pt) film 115 to be worked into first capacitor electrodes is deposited all over. Part of the platinum film 115 outside the opening portions 114 is removed by a CMP method, so that the opening portions 114 are filled with the left part of the platinum film 115 (damascene method). The platinum film 115 may be deposited by, e.g., a CVD method, or formed by a plating method. The portions of the platinum film 115 embedded in the opening portions 114 are to be used as first capacitor electrodes. The first capacitor electrodes 115 are disposed at positions between every other pair of adjacent transistors.

Figure 3A:
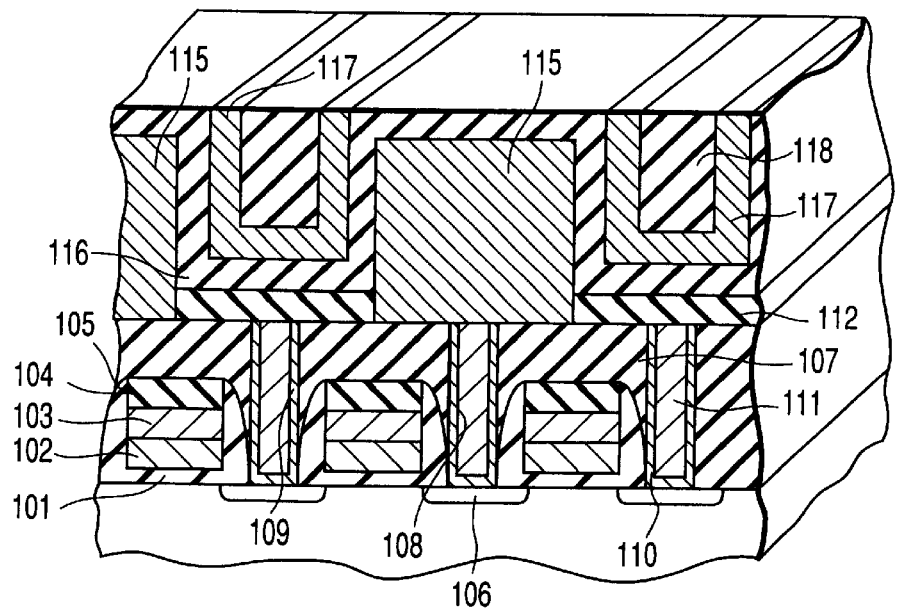
FIGS. 3A and 3B are sectional-perspective views showing steps of manufacturing the ferroelectric memory according to the first embodiment, following FIG. 2C.

Then, as shown in FIG. 3A, the CVD oxide film 113 is removed by etching. Then, a PZT film or ferroelectric film 116 to be worked into capacitor insulating films, and a platinum film 117 to be worked into second capacitor electrodes are deposited all over in this order by CVD methods. If necessary, a heat treatment is then performed at about 600° C. to promote crystallization of the PZT film 116. Then, a CVD oxide film 118 is deposited all over as an embedded insulating film. Part of the CVD oxide film 118 and the second platinum film 117 outside the gaps between the first capacitor electrodes 115 are removed by a CMP method.

As a result, the PZT film 116 is left to cover the two sides and the top of each of the first capacitor electrodes 115. In each of the gaps between the first capacitor electrodes 115, a U-shaped left portion of the second platinum film 117 is embedded in the recess of a U-shaped left portion of the PZT film 116, and a left portion of the insulating film 118 is embedded in the recess of the left portion of the second platinum film 117.

Figure 3B:
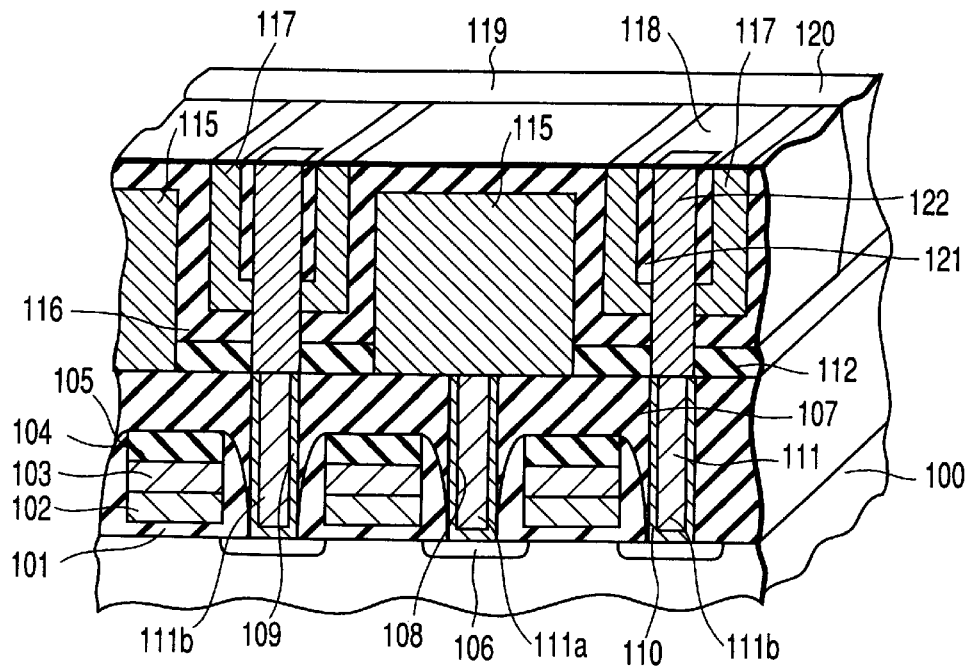

Then, as shown in FIG. 3B, trenches 119 are formed between cells by a photo-lithography method and an RIE method, and are filled with oxide films 120, so that capacitor sections are separated from each other. Then, contact holes 121 are formed at positions between the first capacitor electrodes 115, to penetrate the films 118, 117, 116, and 112 and communicate with the contact holes 109. The contact holes 121 are filled with upper plugs, e.g., tungsten films 122, so that the second capacitor electrodes 117 are electrically connected to the corresponding source/drain regions 106 of the transistors. After this step, the ferroelectric memory is completed through a step of forming Al or Cu wiring layers, though this step is not shown.

As described above, the ferroelectric memory according to this embodiment has cell structures in each of which a transistor and a capacitor are connected in parallel. The first capacitor electrode 115 like a block is disposed on the first plug 111a, which is embedded in the contact hole 108 connected one of the source/drain regions 106. The second capacitor electrode 117 is disposed on the second plug 111b, which is embedded in the contact hole 109 connected to the other of source/drain regions 106. The second capacitor electrode 117 faces a side surface (one of the capacitor faces) of the first capacitor electrode 115 through the ferroelectric film 116. With this arrangement, three-dimensional capacitors are respectively disposed on the two sides of the first capacitor electrode 115, and are used as individual capacitors adjacent to each other.

Figure 4:
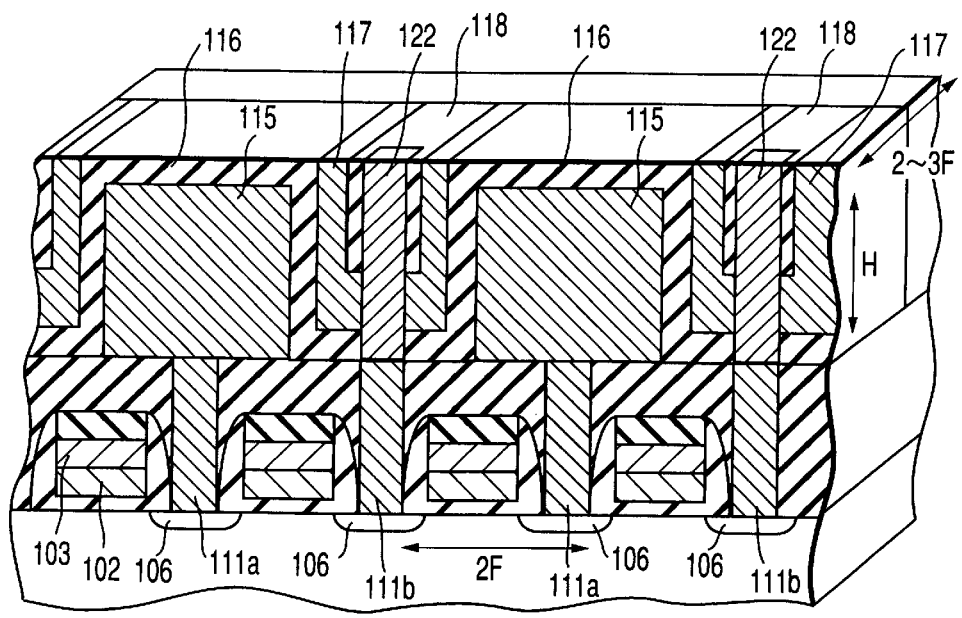
FIG. 4 is a sectional-perspective view showing the ferroelectric memory according to the first embodiment, along with a design rule.

The three-dimensional arrangement of capacitors described above is applied to this ferroelectric memory of the ladder structure type, thereby bringing about a great advantage. FIG. 4 is a sectional-perspective view showing the ferroelectric memory according to the first embodiment, along with a design rule. As shown in FIG. 4, the switching transistors are disposed at intervals two times larger than a feature size of F in the highly integrated cell arrangement. The ferroelectric capacitors are connected to the transistors respectively in parallel. The first capacitor electrode 115 like a block is disposed on the plug 111a led out from one of the source/drain regions of each transistor. The first capacitor electrode 115 has two vertical capacitor faces, which expand perpendicularly to the surface of the substrate 100 and to the channel direction of the transistors. The two side surfaces of the first capacitor electrode 115 are used as part of individual capacitors adjacent to each other.

In the channel direction of the transistors, the cells each including a capacitor can be disposed at the smallest intervals of 2F. In a direction perpendicular to the channel direction, the cells can be disposed at intervals of 2F in principle, but they are disposed at intervals of 2F to 3F in practice. In this case, the cells can be disposed with a layout of 2F×(2F to 3F)=4$F^2$ to 6$F^2$, thereby reducing the area occupied by the cells.

Figure 5:
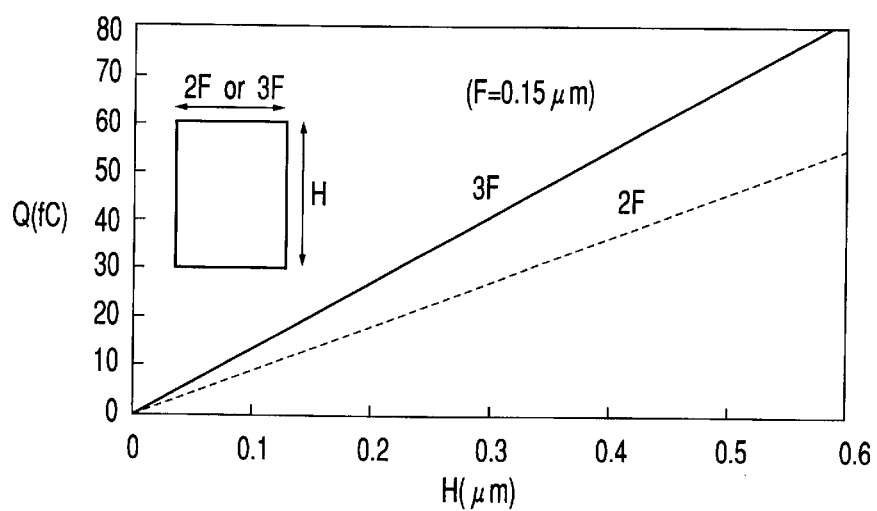
FIG. 5 is a graph showing a relationship between electrode height and polarization quantity in a capacitor of the ferroelectric memory according to the first embodiment.

FIG. 5 is a graph showing a relationship between electrode height H and polarization quantity Q in the capacitor of the ferroelectric memory according to the first embodiment, taking a design rule of F=0.15 μm as an example. This graph is plotted according to a case where the PZT film has a polarization density of 30 μC/cm$^2$, and the depth of the capacitor shown in FIG. 4 is 2F or 3F. As is obvious in FIG. 5, even with a practical height of the capacitor, it is confirmed to realize a ferroelectric capacitor cell of 2F×2F=4$F^2$ or of 2F×3F=6$F^2$.

More specifically, where H is 0.3 μm, for example, the depth of 2F results in a polarization quantity of about 30 fC, and the depth of 3F results in a polarization quantity of about 40 fC. These polarization quantities are several times larger than that of a flat capacitor of the same design rule. Accordingly, a sufficient polarization quantity can be obtained even with a practical height of the capacitor, in the ferroelectric memory of 4$F^2$ or 6$F^2$ according to this embodiment.

Furthermore, according to this embodiment, when the first capacitor electrodes 115 are formed, they are once worked into stripes extending in a direction perpendicular to the channel direction of the transistors. Consequently, the side surfaces to be used for capacitors are worked flat. After the second capacitor electrodes 117 are formed, stripe capacitors are worked to separate respective cells from each other. With this process, a conversion error in shape due to lithography or working can be minimized, as compared to a case where electrodes are worked into blocks on respective cells in advance.

The second capacitor electrodes 117 are worked in a self-alignment manner, using a CMP method, without any lithography step, thereby effectively simplifying the process steps. In addition, there is no problem about fitting errors caused by a lithography step, thereby being greatly advantageous in downsizing and high degree of integration. Also, when the plugs connecting the second capacitor electrodes 117 to the source/drain regions 106 of the transistors are formed, the plugs can be worked in a self-alignment manner with an RIE step designed to etch the plugs with high selectivity relative to the electrode material.

As described above, this embodiment reduces problems about the conversion error and fluctuation of patterns due to lithograph or downsize-working. These problems minimally affect the polarization quantity of the capacitors. As a result, it is possible to improve downsizing, degree of integration, and reliability.

Accordingly, the ferroelectric memories according to this embodiment can be applied to many fields and directions, such as temperature-humidity sensors of air conditioners; TAGs for monitoring manufacturing processes of various electronic devices; resume functions of TV games; memories of arcade games; setting memories of TVs and videos; monitors for operation states of copiers, FAXs, or printers; set-top boxes of satellite broadcasting or cable TVs; engine controllers of cars; frequency preset devices of radios; electronic keys using RF-ID; monitors for manufacturing process lines of industrial goods, which generate a lot of noise; integrating wattmeters; flow sensors for industrial liquids and gases; level sensors of large tanks; AV personal computers; PC cards; file memories; and portable terminal devices. These ferroelectric memories can also be used in place of DRAMs, SRAMs, or EEPROMs.

Second Embodiment

FIGS. 6A to 7B are sectional-perspective views showing steps of manufacturing a ferroelectric memory according to a second embodiment. This embodiment is basically the same as the first embodiment, but first capacitor electrodes are not worked by a CMP method, but worked by an RIE method.

Figure 6A:
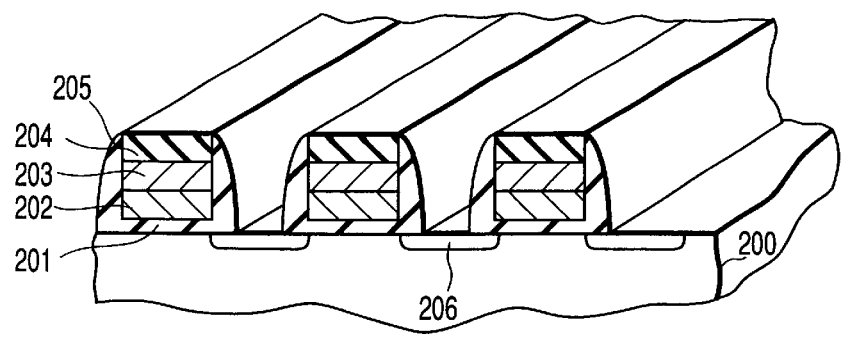
FIGS. 6A to 6C are sectional-perspective views showing steps of manufacturing a ferroelectric memory according to a second embodiment.

First, as in the first embodiment, transistors and so forth are formed. FIG. 6A shows a state fabricated by a process the same as that for FIG. 2A. In FIG. 6A, there is shown a Si substrate 200, an oxide film 201 used as a gate insulating film, n$^+$-polycrystalline Si films 202, WSi$_x$ films 203, nitride films 204 used as gate cover layers, nitride films 205 used as sidewall insulating films, and, source/drain regions 206.

Figure 6B:
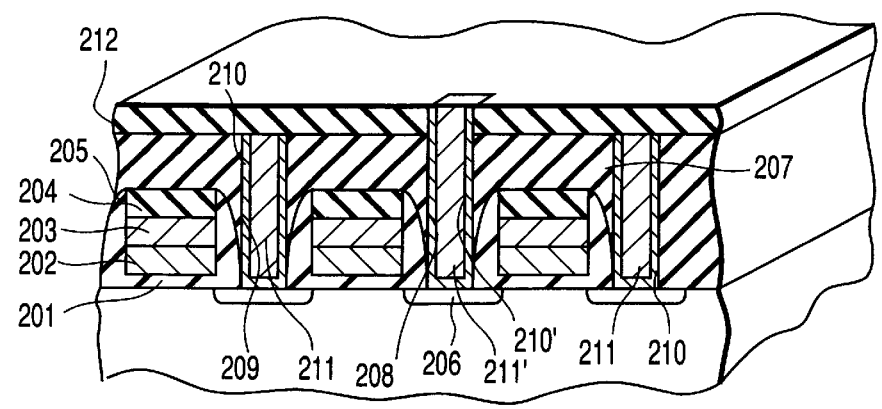

Then, as shown in FIG. 6B, a CVD oxide film 207 is deposited all over as an inter-level insulating film, and is planarized by a CMP method. Contact holes 209 are formed in the insulating film 207 in a self-alignment manner to communicate with source/drain regions 206 of the transistors. Then, a thin titanium film is deposited by a sputtering method or a CVD method, and is heat-treated in a forming gas (N$_2$+H$_2$) to form a TiN film 210. Then, a tungsten film 211 is deposited all over by a CVD method. Part of the tungsten film 211 outside the contact holes 209 is removed, so that the contact holes 209 are filled with the left part of the tungsten film 211.

Then, a CVD nitride film 212 is deposited all over as an inter-level insulating film. Contact holes 208 are formed in the insulating films 207 and 212 in a self-alignment manner to communicate with the other source/drain regions 206 of the transistors. The contact holes 208 are filled with TiN films 210' and CVD tungsten films 211', as in the contact holes 209.

Figure 6C:
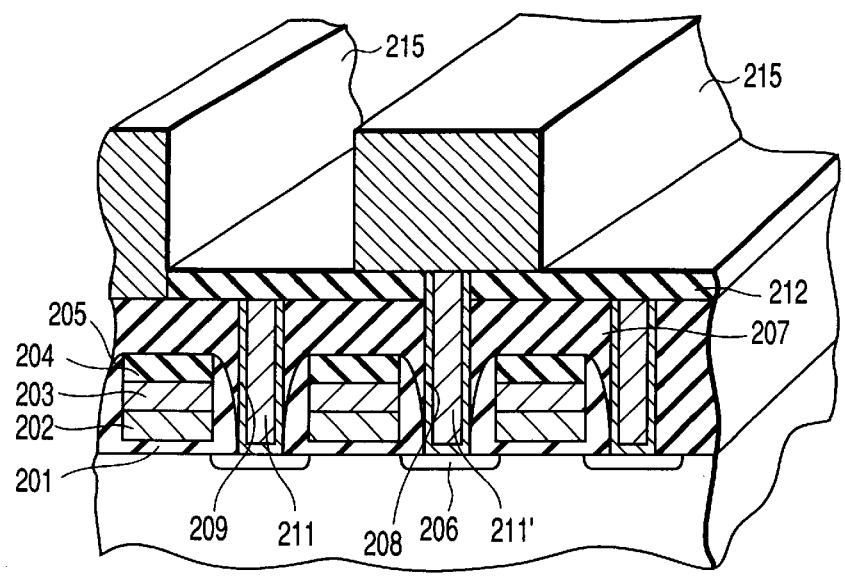

Then, as shown in FIG. 6C, an iridium (Ir) film 215 to be worked into first capacitor electrodes is deposited all over. Then, a CVD-SiO$_2$ film used as a hard mask is deposited and worked by a photo-lithography method and an RIE method. The iridium film 215 is worked by an RIE method, using the SiO$_2$ film as a mask, and then the SiO$_2$ film is removed by etching to leave an iridium pattern. In this case, the iridium film 215 may be formed by an appropriate method, such as a sputtering method, a CVD method, or a plating method.

Figure 7A:
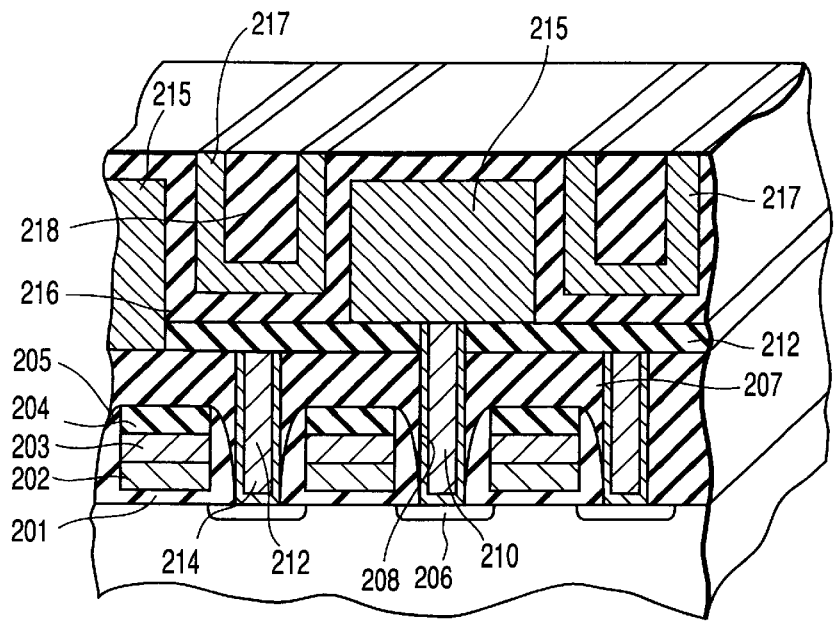
FIGS. 7A and 7B are sectional-perspective views showing steps of manufacturing the ferroelectric memory according to the second embodiment, following FIG. 6C.

Then, as shown in FIG. 7A, a PZT film or ferroelectric film 216 to be worked into capacitor insulating films, and an iridium film 217 to be worked into second capacitor electrodes are deposited all over in this order by CVD methods. If necessary, a heat treatment is then performed at about 600° C. to promote crystallization of the PZT film 216. Then, a CVD oxide film 218 is deposited all over as an embedded insulating film. Part of the CVD oxide film 218 and the second iridium film 217 outside the gaps between the first capacitor electrodes 215 are removed by a CMP method.

As a result, the PZT film 216 is left to cover the two sides and the top of each of the first capacitor electrodes 215. In each of the gaps between the first capacitor electrodes 215, a U-shaped left portion of the second iridium film 217 is embedded in the recess of a U-shaped left portion of the PZT film 216, and a left portion of the insulating film 218 is embedded in the recess of the left portion of the second iridium film 217.

Figure 7B:
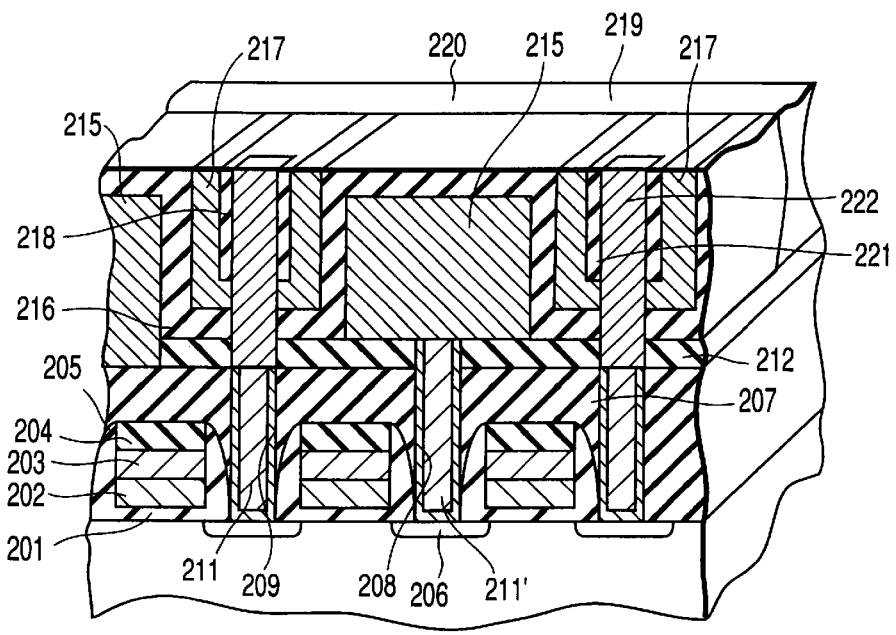

Then, as shown in FIG. 7B, trenches 219 are formed between cells by a photo-lithography method and an RIE method, and are filled with oxide films 220, so that capacitor sections are separated from each other. Then, contact holes 221 are formed at positions between the first capacitor electrodes 215, to penetrate the films 218, 217, 216, and 212 and communicate with the contact holes 209. The contact holes 221 are filled with upper plugs, e.g., tungsten films 222, so that the second capacitor electrodes 217 are electrically connected to the corresponding source/drain regions 206 of the transistors. After this step, the ferroelectric memory is completed through a step of forming Al or Cu wiring layers, though this step is not shown.

The ferroelectric memory thus manufactured has a structure substantially the same as that of the first embodiment, even though it differs therefrom in the forming method of the first capacitor electrodes 215. Accordingly, the second embodiment provides the same effects as the first embodiment. Furthermore, the first capacitor electrodes 215 are formed by an RIE method, thereby advantageously simplifying the process steps, as compared to the first embodiment in which the first capacitor electrodes are formed by a CMP method.

Third Embodiment

FIGS. 8A to 9B are sectional-perspective views showing steps of manufacturing a ferroelectric memory according to a third embodiment. This embodiment is basically the same as the first embodiment, but second capacitor electrodes are not worked by a CMP method, but worked by a sidewall-leaving process using an RIE method.

Figure 8A:
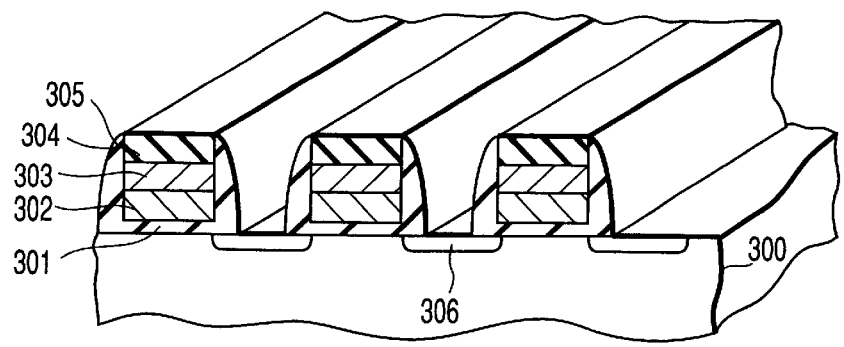
FIGS. 8A to 8C are sectional-perspective views showing steps of manufacturing a ferroelectric memory according to a third embodiment.
Figure 8B:
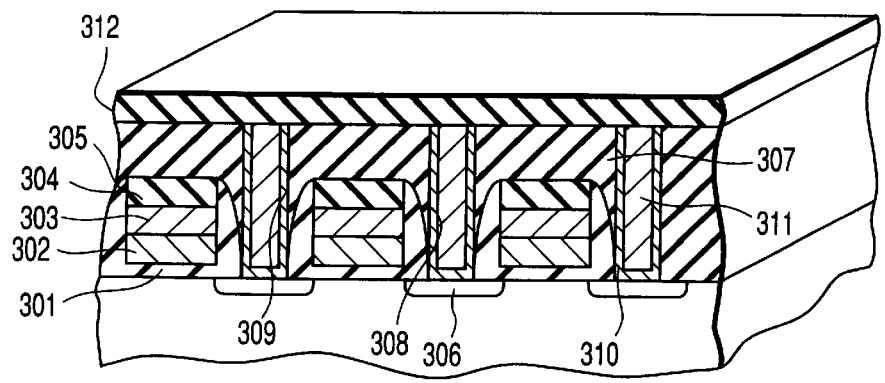
Figure 8C:
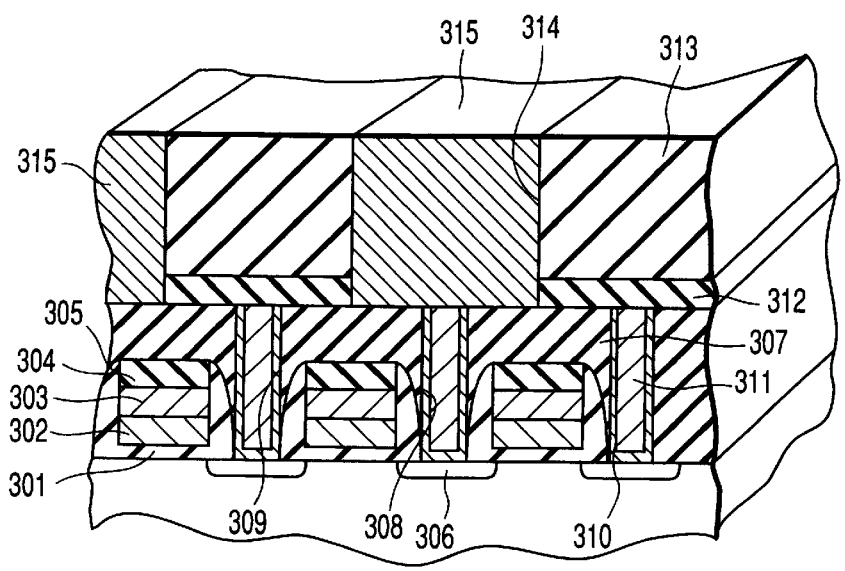

First, the steps shown in FIGS. 8A to 8C are performed in accordance with the first embodiment. Namely, transistors are formed on substrate 300, and then plugs 311 and first capacitor electrodes 315 are formed. Note that, members denoted with reference symbols 300 to 315 in FIGS. 8A to 8C correspond to the members denoted with reference symbols 100 to 115 in FIGS. 2A to 2C, respectively.

Figure 9A:
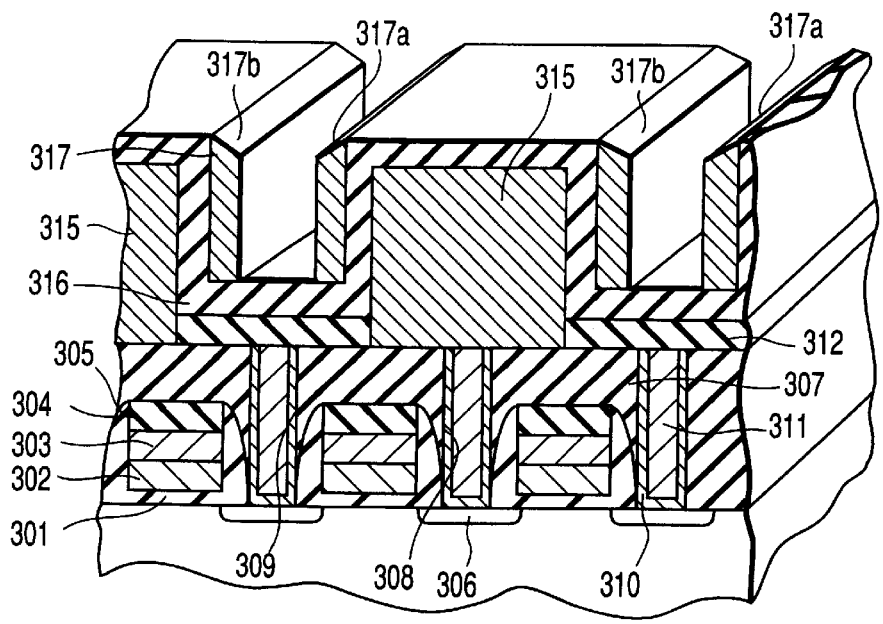
FIGS. 9A and 9B are sectional-perspective views showing steps of manufacturing the ferroelectric memory according to the third embodiment, following FIG. 8C.

Then, as shown in FIG. 9A, the CVD oxide film 313 is removed by etching. Then, a PZT film or ferroelectric film 316 to be worked into capacitor insulating films, and a platinum film 317 to be worked into second capacitor electrodes are deposited all over in this order by CVD methods. If necessary, a heat treatment is then performed at about 600° C. to promote crystallization of the PZT film 316. Then, the platinum film 317 is worked by a sidewall-leaving process using an RIE method. Specifically, the platinum film 317 is anisotropically etched all over to the thickness of the platinum film 317 by an RIE method, so that portions of the platinum film 317 are left only on sidewalls of the first capacitor electrodes 315.

As a result, each of the second capacitor electrodes derived from the platinum film 317 comprises first and second portions 317a and 317b, which are disposed on the PZT films 316 between adjacent first capacitor electrodes 315, and are separated from each other, but are made of the same material. The first and second portions 317a and 317b are to be electrically connected to each other by an upper plug, as described later. The first and second portions 317a and 317b have upper ends, which are inclined downward with an increase in the distance from the respective PZT films 316, because of the effect of the anisotropic etching.

Figure 9B:
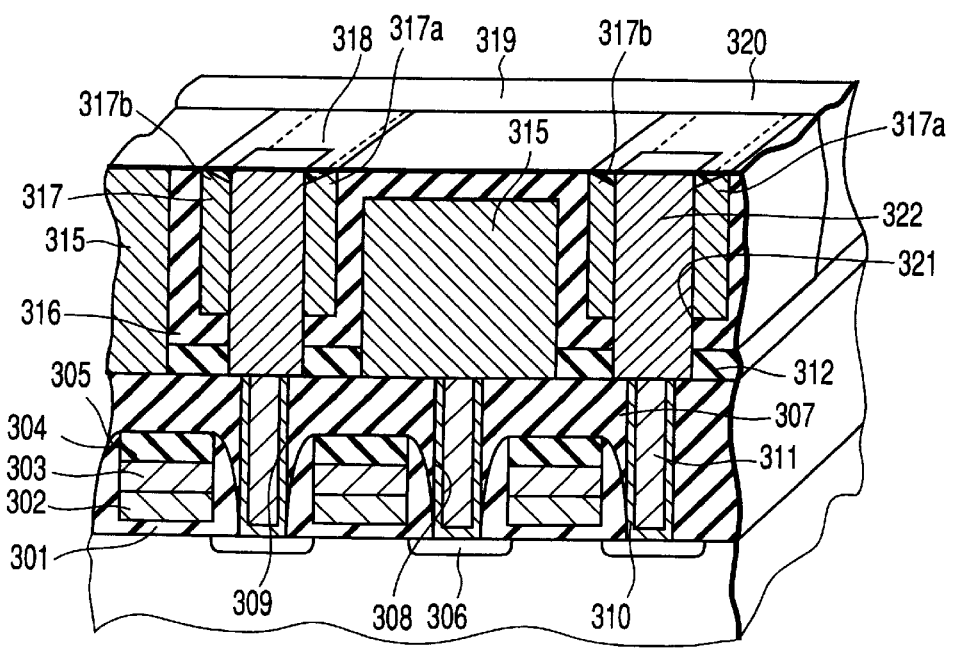

Then, as shown in FIG. 9B, a CVD oxide film 318 is deposited all over as an embedded insulating film. Part of the CVD oxide film 318 outside the gaps between the first and second portions 317a and 317b of the second capacitor electrodes 317 are removed by a CMP method. Then, trenches 319 are formed between cells by a photolithography method and an RIE method, and are filled with oxide films 320, so that capacitor sections are separated from each other.

Then, contact holes 321 are formed at positions between the first capacitor electrodes 315, to penetrate the films 318, 316, and 312 and communicate with the contact holes 309. At this time, the contact holes 321 can be formed in a self-alignment manner, using an RIE method with high selectivity relative to the platinum and PZT films. The contact holes 321 are filled with upper plugs, e.g., tungsten films 322, so that the first and second portions 317a and 317b of each second capacitor electrode 317 are electrically connected to each other, and the second capacitor electrodes 317 are electrically connected to the corresponding source/drain regions 306 of the transistors. After this step, the ferroelectric memory is completed through a step of forming Al or Cu wiring layers, though this step is not shown.

The ferroelectric memory thus manufactured has a structure substantially the same as that of the first embodiment, even though it differs therefrom in the forming method of the second capacitor electrodes 317. Accordingly, the third embodiment provides the same effects as the first embodiment. Furthermore, the upper plugs 322 are in contact with the second capacitor electrodes 317 over a wide surface area, thereby advantageously reducing the contact resistance therebetween.

The present invention is not limited to the embodiments described above. For example, the embodiments employ PZT (lead zirconate titanate) as the material of the ferroelectric film, but they may employ other materials, such as one containing as the main component a metal oxide having a perovskite structure. The ferroelectric film may be made of still another material, such as $PbTiO_3$, $SrBi_2Ta_2O_9$ (SBT), or $BaTiO_3$ (BTO). The metal of the first or second capacitor electrodes is not limited to platinum or iridium, but may be $IrO_x$, Ru, $RuO_x$, $SrRuO_3$, or a combination thereof. The material of the substrate is not limited to silicon, but may be selected from various kinds of semiconductor materials.

The first capacitor electrodes (denoted with 115, 215, and 315 in the embodiments) may be worked by either a damascene method using a CMP method, or an RIE method. In the case of the damascene method, the electrode metal film may be formed by a CVD method or a plating method. In this case, the pattern of the electrodes is formed of trenches, in which the electrodes are relatively easily embedded. In the case of the RIE method, the electrode metal film may be formed by a method selected from various film formation methods, such as a sputtering method, a CVD method, and a plating method.

The second capacitor electrodes (denoted with 117, 217, and 317 in the embodiments) may be worked in a self-alignment manner by either a CMP method or a sidewall-leaving process using an RIE method. In either case, the electrodes are worked without any lithography step, thereby effectively simplifying the process steps. In addition, there is no problem about fitting errors caused by a lithography step, thereby being greatly advantageous in downsizing and high degree of integration.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A ferroelectric memory comprising:

a semiconductor substrate;

first, second, and third source/drain regions formed in a surface of the substrate, the first source/drain region being interposed between the second and third source/drain regions;

first and second gate electrodes facing, through a gate insulating film, a first channel region between the first and second source/drain regions, and a second channel region between the first and third source/drain regions, respectively;

an inter-level insulating film covering the first, second, and third source/drain regions;

first, second, and third plugs penetrating the inter-level insulating film, and electrically connected to the first, second, and third source/drain regions, respectively;

a first capacitor electrode disposed above the first source/drain region, and electrically connected to the first source/drain region via the first plug;

first and second capacitor insulating films each comprising a ferroelectric film, formed on side surfaces of the first capacitor electrode facing the second and third source/drain regions;

second and third capacitor electrodes disposed above the second and third source/drain regions, and electrically connected to the second and third source/drain regions via the second and third plugs, respectively, the second and third capacitor electrodes facing the first capacitor electrode through the first and second capacitor insulating films, respectively;

a fourth source/drain region formed in the surface of the substrate, the second source/drain region being interposed between the first and fourth source/drain regions;

a third gate electrode facing through a gate insulating film a third channel region between the second and fourth source/drain regions;

the inter-level insulating film covering the fourth source/drain region;

a fourth plug penetrating the inter-level insulating film, and electrically connected to the fourth source/drain region;

a fourth capacitor electrode disposed above the fourth source/drain region, and electrically connected to the fourth source/drain region via the fourth plug; and a third capacitor insulating film comprising a ferroelectric film, formed on a side surface of the fourth capacitor electrode facing the second source/drain region, the second capacitor electrode facing the fourth capacitor electrode through the third capacitor insulating film, wherein the first and third capacitor insulating films comprise respective standing portions of a U-shaped insulating film disposed between the first and fourth capacitor electrodes, and the second capacitor electrode is disposed inside the U-shaped insulating film, and is electrically connected to the second plug via an upper plug penetrating a bottom portion of the U-shaped insulating film.

2. The memory according to claim 1, wherein the upper plug penetrates the second capacitor electrode and extends to an upper end of the second capacitor electrode.

3. The memory according to claim 1, wherein the second capacitor electrode comprises a recess formed above the second plug, and an embedded insulating film is disposed in the recess.

4. The memory according to claim 3, wherein the upper plug penetrates the embedded insulating film and extends to an upper end of the second capacitor electrode.

5. The memory according to claim 1, wherein the second capacitor electrode comprises first and second portions respectively disposed on the first and third capacitor insulating films, the first and second portions being separated from each other, comprising a material the same as each other, and electrically connected to each other by the upper plug.

6. The memory according to claim 5, wherein the first and second portions comprise upper ends, which are inclined downward with an increase in distance from the first and third capacitor insulating films, respectively.

7. The memory according to claim 1, wherein an intermediate insulating film is disposed between the inter-level insulating film and the bottom portion of the U-shaped insulating film, and the upper plug penetrates the intermediate insulating film.

8. The memory according to claim 1, wherein an intermediate insulating film is disposed between the inter-level insulating film and a bottom of the first capacitor electrode, and the first plug penetrates the intermediate insulating film.

9. The memory according to claim 1, wherein an upper side of the first capacitor electrode is covered with an insulating film, which is formed integrally with the first and second capacitor insulating films and connects upper ends of the first and second capacitor insulating films to each other.

10. A ferroelectric memory comprising:

a semiconductor substrate;

a plurality of source/drain regions formed in a surface of the substrate;

a plurality of gate electrodes respectively facing, through gate insulating films, channel regions between the source/drain regions;

an inter-level insulating film covering the source/drain regions;

a plurality of connection plugs penetrating the inter-level insulating film, and electrically connected to the respective source/drain regions;

a plurality of first capacitor electrodes and a plurality of second capacitor electrodes alternately disposed one by one above the source/drain regions, and having side surfaces facing each other, the first and second capacitor electrodes being electrically connected to the source/drain regions via the connection plugs; and a plurality of capacitor insulating films, each comprising a ferroelectric film, sandwiched between the side surfaces of the first and second capacitor electrodes;

wherein, between each pair of adjacent two of the first capacitor electrodes, a pair of adjacent two of the capacitor insulating films comprise respective standing portions of a U-shaped insulating film disposed between the pair of first capacitor electrodes, and a corresponding one of the second capacitor electrodes is disposed inside the U-shaped insulating film, and is electrically connected to the connection plug via an upper plug penetrating a bottom portion of the U-shaped insulating film.

11. The memory according to claim 10, wherein the upper plug penetrates the second capacitor electrode and extends to an upper end of the second capacitor electrode.

12. The memory according to claim 10, wherein each second capacitor electrode comprises a recess formed above the connection plug, and an embedded insulating film is disposed in the recess.

13. The memory according to claim 12, wherein the upper plug penetrates the embedded insulating film and extends to an upper end of the second capacitor electrode.

14. The memory according to claim 10, wherein each second capacitor electrode comprises first and second portions respectively disposed on the pair of capacitor insulating films, the first and second portions being separated from each other, comprising a material the same as each other, and electrically connected to each other by the upper plug.

15. The memory according to claim 14, wherein the first and second portions comprise upper ends, which are inclined downward with an increase in distance from the pair of capacitor insulating films, respectively.

16. The memory according to claim 10, wherein an intermediate insulating film is disposed between the inter-level insulating film and the bottom portion of the U-shaped insulating film, and the upper plug penetrates the intermediate insulating film.

17. The memory according to claim 10, wherein an intermediate insulating film is disposed between the inter-level insulating film and a bottom of each first capacitor electrode, and the connection plug penetrates the intermediate insulating film.

18. The memory according to claim 10, wherein an upper side of each first capacitor electrode is covered with an insulating film, which is formed integrally with two capacitor insulating films on opposite sides of the first capacitor electrode and connects upper ends of the two capacitor insulating films to each other.

* * * * *

UNITED STATES PATENT AND TRADEMARK OFFICE
CERTIFICATE OF CORRECTION

PATENT NO. : 6,586,793 B2
DATED : July 1, 2003
INVENTOR(S) : Imai et al.

It is certified that error appears in the above-identified patent and that said Letters Patent is hereby corrected as shown below:

<u>Title page,</u>
Item [54], Title, after "MEMORY" delete "AND MANUFACTURING METHOD THEREOF".

Signed and Sealed this

Twenty-eighth Day of October, 2003

JAMES E. ROGAN
*Director of the United States Patent and Trademark Office*